(12) United States Patent
Chen (10) Patent No.: US 11,430,770 B2
(45) Date of Patent: Aug. 30, 2022

(54) LED SUBSTRATE AND METHOD FOR MANUFACTURING LED DISPLAY PANEL

(71) Applicant: Shenzhen China Star Optoelectronics Semiconductor Display Technology Co., Ltd., Shenzhen (CN)

(72) Inventor: Shujhih Chen, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 255 days.

(21) Appl. No.: 16/625,813

(22) PCT Filed: Nov. 11, 2019

(86) PCT No.: PCT/CN2019/117054
§ 371 (c)(1),
(2) Date: Dec. 23, 2019

(87) PCT Pub. No.: WO2021/047008
PCT Pub. Date: Mar. 18, 2021

(65) Prior Publication Data
US 2021/0358892 A1 Nov. 18, 2021

(30) Foreign Application Priority Data
Sep. 11, 2019 (CN) .......................... 201910856251.2

(51) Int. Cl.
*H01L 25/075* (2006.01)
*H01L 33/62* (2010.01)
*H01L 27/12* (2006.01)

(52) U.S. Cl.
CPC ...... *H01L 25/0753* (2013.01); *H01L 27/1214* (2013.01); *H01L 33/62* (2013.01); *H01L 2933/0066* (2013.01)

(58) Field of Classification Search
CPC . H01L 25/0753; H01L 25/167; H01L 25/075; H01L 33/62; H01L 33/486; H01L 33/50; H01L 33/58; H01L 33/60
See application file for complete search history.

(56) References Cited

U.S. PATENT DOCUMENTS

2019/0044023 A1* 2/2019 Cheng .................... H01L 33/62
2019/0165214 A1 5/2019 Hsu
(Continued)

FOREIGN PATENT DOCUMENTS

CN 108140667 A 6/2018
CN 108493154 A 9/2018
(Continued)

*Primary Examiner* — Sue A Purvis
*Assistant Examiner* — Scott Stowe
(74) *Attorney, Agent, or Firm* — Luedeka Neely Group, P.C.

(57) ABSTRACT

The present application provides an LED substrate and a method for manufacturing an LED display panel. The LED substrate comprises a substrate, a colloid, and LED chips. The colloid is set on the substrate, and the LED chips comprise a first end surface and a second end surface, wherein the first end surface and the second end surface are set opposite to each other, the first end surface is for fixedly connecting a thin film transistor substrate, and the second end surface is a light outputting surface. The second end surface of the LED chips is fixedly set on the substrate by the colloid.

4 Claims, 5 Drawing Sheets

(56) References Cited

U.S. PATENT DOCUMENTS

| | | |
|---|---|---|
| 2019/0326470 A1 | 10/2019 | Bower et al. |
| 2019/0333897 A1 | 10/2019 | Chen |
| 2020/0028030 A1 | 1/2020 | Lan et al. |
| 2020/0235078 A1* | 7/2020 | Jang ........................ H01L 33/24 |

FOREIGN PATENT DOCUMENTS

| | | |
|---|---|---|
| CN | 207993392 U | 10/2018 |
| CN | 109004078 A | 12/2018 |
| CN | 109192835 A | 1/2019 |
| CN | 109449259 A | 3/2019 |
| CN | 109860157 A | 6/2019 |
| CN | 110034212 A | 7/2019 |
| CN | 110832572 A | 2/2020 |
| TW | 201919104 A | 5/2019 |
| WO | 2019013120 A1 | 1/2019 |

\* cited by examiner

LED SUBSTRATE AND METHOD FOR MANUFACTURING LED DISPLAY PANEL

BACKGROUND OF INVENTION

Field of Invention

The present application relates to a display technology, and particularly to an LED substrate and a method for manufacturing an LED display panel.

Description of Prior Art

Currently, in the method for manufacturing a micro light-emitting diode (micro-LED) display panel, limited by influences of equipment precision and machine size, the manufacturing method is as follows: firstly, placing LEDs on a temporary substrate; secondly, grabbing the LEDs placed on the temporary substrate with a transferring device and jointing them with thin film transistor substrates to form small-sized display panels; and finally, splicing the small-sized display panels to form a large-sized display panel.

For example, to form an 80 inch display panel, the present practice is jointing a 10-inch thin film transistor substrate with LEDs to form a 10-inch display panel and then integrating 8*8=64 pieces of small-sized display panels by splicing to achieve display. However, seamless splicing technique has a high level of difficulty, which will reduce the product yield.

SUMMARY OF INVENTION

The embodiments of the present application provide a LED substrate and a method for manufacturing LED display panel, to solve the technical problem of low production yield when manufacturing large size micro-LED display panel by the present method for manufacturing micro-LED display panel.

The embodiment of the present application provides an light-emitting diode (LED) substrate for manufacturing an LED display panel, wherein the LED substrate comprises:
  a substrate, wherein the substrate is a hard substrate;
  a colloid set on the substrate; and
  a plurality of LED chips, wherein the LED chips comprise a first end surface and a second end surface, the first end surface and the second end surface are set opposite to each other, the first end surface is for fixedly connecting with a thin film transistor substrate, and the second end surface is a light outputting surface;
  wherein the second end surface of the LED chips is fixedly set on the substrate by the colloid.

In the LED substrate of the present application, the LED substrate comprises a plurality of concave parts, and each of the LED chips is fixedly set inside the concave parts by the colloid.

In the LED substrate of the present application, the concave parts are concaved from a surface of the substrate facing the LED chips towards a surface of the substrate opposite to the LED chips.

In the LED substrate of the present application, the LED substrate comprises an auxiliary layer, the auxiliary layer is set on the substrate, and the auxiliary layer comprises a plurality of through holes that expose the substrate;
  wherein the through holes and the exposed substrate define the concave parts.

In the LED substrate of the present application, a material of the auxiliary layer is a photoresist material.

The embodiment of the present application provides an light-emitting diode (LED) substrate for manufacturing an LED display panel, wherein the LED substrate comprises:
  a substrate;
  a colloid set on the substrate; and
  a plurality of LED chips, wherein the LED chips comprise a first end surface and a second end surface, the first end surface and the second end surface are set opposite to each other, the first end surface is for fixedly connecting with a thin film transistor substrate, and the second end surface is a light outputting surface;
  wherein the second end surface of the LED chips is fixedly set on the substrate by the colloid.

In the LED substrate of the present application, the LED substrate comprises a plurality of concave parts, and each of the LED chips is fixedly set inside the concave parts by the colloid.

In the LED substrate of the present application, the concave parts are concaved from a surface of the substrate facing the LED chips towards a surface of the substrate opposite to the LED chips.

In the LED substrate of the present application, the LED substrate comprises an auxiliary layer, the auxiliary layer is set on the substrate, and the auxiliary layer comprises a plurality of through holes that expose the substrate;
  wherein the through holes and the exposed substrate define the concave parts.

In the LED substrate of the present application, a material of the auxiliary layer is a photoresist material.

The embodiment of the present application provides a method for manufacturing an LED display panel, comprising:
  providing an LED substrate;
  providing at least one thin film transistor substrate;
  setting a jointing material on the LED substrate or on the at least one thin film transistor substrate; and
  jointing the at least one thin film transistor substrate onto the LED substrate.

In the method for manufacturing a LED display panel of the present application, the LED substrate comprises a plurality of LED chips, the LED chips comprise a first end surface and a second end surface, the first end surface and the second end surface are set opposite to each other, the first end surface is for fixedly connecting with the at least one thin film transistor substrate, and the second end surface is a light outputting surface; and
  the step of providing the LED substrate, further comprising:
    providing a substrate;
    setting a colloid on the substrate; and
    adhering the second end surface of the LED chips to the colloid.

In the method for manufacturing a LED display panel of the present application, the LED substrate comprises a plurality of LED chips, the LED chips comprise a first end surface and a second end surface, the first end surface and the second end surface are set opposite to each other, the first end surface is for fixedly connecting with the at least one thin film transistor substrate, and the second end surface is a light outputting surface; and
  the step of providing the LED substrate, further comprising:
    providing a substrate;
    concaving the substrate to form a plurality of concave parts;
    setting a colloid on a bottom surface of the concave parts; and adhering the second end surface of the LED chips to the colloid, such that the LED chips are set inside the concave parts.

In the method for manufacturing a LED display panel of the present application, the LED substrate comprises a plurality of LED chips, the LED chips comprise a first end surface and a second end surface, the first end surface and the second end surface are set opposite to each other, the first end surface is for fixedly connecting with the at least one thin film transistor substrate, and the second end surface is a light outputting surface; and the step of providing the LED substrate, further comprising:

providing a substrate;

coating a photoresist layer on the substrate;

patterning the photoresist layer to form an auxiliary layer, wherein the auxiliary layer comprises a plurality of through holes that expose the substrate, and the through holes and the exposed substrate define concave parts;

setting a colloid on a bottom surface of the concave parts; and adhering the second end surface of the LED chips to the colloid, such that the LED chips are set inside the concave parts.

In the method for manufacturing a LED display panel of the present application, the jointing material is a heterogeneous conductive film or solder; and the step of jointing the at least one thin film transistor substrate on the LED substrate, further comprising:

jointing thin film transistors of the at least one thin film transistor substrate with the first end surface of a corresponding LED chip by the jointing material.

In the method for manufacturing a LED display panel of the present application, the jointing material is a heterogeneous conductive film or solder; and the step of jointing the at least one thin film transistor substrate on the LED substrate, further comprising:

jointing thin film transistors of the at least one thin film transistor substrate with the first end surface of a corresponding LED chip by the jointing material.

In the method for manufacturing a LED display panel of the present application, the jointing material is a heterogeneous conductive film or solder; and the step of jointing the at least one thin film transistor substrate on the LED substrate, further comprising:

jointing thin film transistors of the at least one thin film transistor substrate with the first end surface of a corresponding LED chip by the jointing material.

Compared with the method for manufacturing micro-LED display panel of prior art, the method for manufacturing LED display panel of the present application forms a large-sized LED display panel directly, by first fixing the LED chips on the substrate to form an LED substrate, and then jointing a plurality of thin film transistor substrates with the LED chips of the LED substrate correspondingly, which solves the technical problem of low production yield when manufacturing large-sized micro-LED display panel by the present method for manufacturing micro-LED display panel.

BRIEF DESCRIPTION OF DRAWINGS

To clearly describe the embodiments of this application or the technical solution of the prior art, following is the brief description of the drawings required in the embodiments of the present invention.

The drawings described below only illustrate partial embodiments of this application. A person skilled in the art can obtain other figures according to these figures without creative work.

DETAILED DESCRIPTION OF PREFERRED EMBODIMENTS

Please refer to the schematic diagram and the flow chart attached, wherein the same component symbol represents the same component. The following description is based on the illustrated specific embodiments of this application and shall not be deemed to restrict other embodiments that are not described herein.

Figure 1:
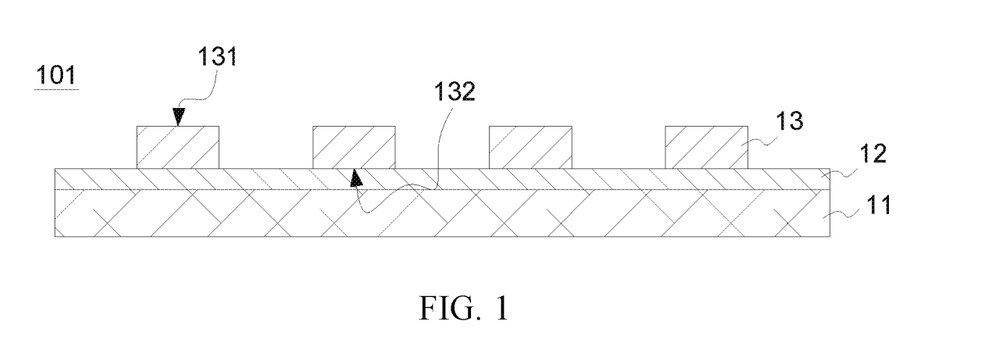
FIG. 1 is a structural schematic diagram of an LED substrate of a first embodiment of the present application.

Please refer to FIG. 1, FIG. 1 is a structural schematic diagram of an LED substrate of a first embodiment of the present application.

The LED substrate 101 in the first embodiment is for jointing with a plurality of thin film transistor substrates to form an LED display panel. Wherein, during a process of manufacturing the LED display panel, the plurality of thin film transistor substrates can be integrated onto the single LED substrate 101, and no further splicing is needed, which simplifies the manufacturing process.

Specifically, the LED substrate 101 comprises a substrate 11, a colloid 12, and a plurality of LED chips 13.

Based on actual conditions of demand, the substrate 11 can be a hard substrate, for example, a glass substrate, and can also be a flexible substrate, for example, a polyimide substrate. In this first embodiment, the substrate 11 is a hard substrate, but it is not limited to that.

The colloid 12 is set on the substrate 11. The colloid 12 can be one of hot degumming, hot melt adhesive, or ultra-violet (UV) curing adhesive, but it is not limited to that.

The LED chips 13 comprise a first end surface 131 and a second end surface 132. The first end surface 131 and the second end surface 132 are set opposite to each other. The first end surface is for fixedly connecting with a thin film transistor substrate. The second end surface is a light outputting surface. Wherein, in this first embodiment, the LED chips 13 are micro-LEDs, but are not limited to that.

The second end surface 132 of the LED chips 13 is fixedly set on the substrate 11 by the colloid 12.

Wherein, the colloid 12 flatly covers the substrate 11, and can be formed by a one-time coating, which simplifies the providing process of the LED substrate 101.

During the process of providing the LED substrate 101, setting the LED chips 13 on the colloid 12 by surface mounting technology (SMT) according to a predetermined LED chip pattern. As some of the LED chips 13 may experience position deviation during the SMT process, a timely adjustment is needed. To solve such technical problem, in this first embodiment, the colloid 12 can be hot degumming or hot melt adhesive, which facilitates adjustment of the LED chip 13.

Following is the description with an example of hot melt adhesive: the hot melt adhesive has the characteristics of three forms, namely an initial state, a hot melt state, and a curing state. The distribution of the adhesive natures of the three forms are 2%, 10%, and 100%, respectively. In the SMT process, the hot melt adhesive is in the initial state with the lowest adhesive nature, thereby facilitating the adjustment of the LED chips 13 having position deviation, and the hot melt adhesive in this state can also preliminarily fix the LED chips 13. Conducting hot melt after jointing and fixing to completely fix the LED chips 13 on the substrate 11.

In addition, UV curing adhesive also has two forms, namely an initial state with lower adhesive nature and a curing state with higher adhesive nature. UV irradiation is required for curing. And of course, the colloid 12 can be other glues.

Hence, alternatively, the colloid 12 is a colloid having at least two different kinds of adhesive nature.

Concerning the method for providing LED substrate in this first embodiment, please refer to the detail of the step of providing LED substrate of the method for manufacturing the display panel in this first embodiment, the same content will not be described herein.

Figure 2:
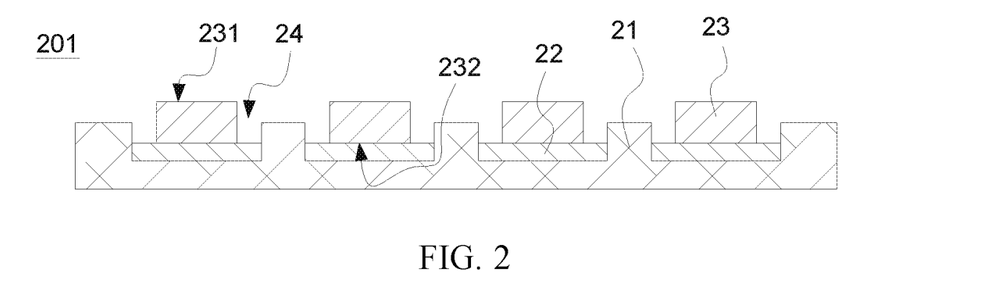
FIG. 2 is a structural schematic diagram of an LED substrate of a second embodiment of the present application.

Please refer to FIG. 2, FIG. 2 is a structural schematic diagram of an LED substrate of a second embodiment of this application. The LED substrate 201 of the second embodiment of this application comprises a substrate 21, a colloid 22, and a plurality of LED chips 23. The difference between this second embodiment and the first embodiment is:

A plurality of concave parts 24 are set on the LED substrate 201. Each LED chip 23 is fixedly set inside the concave part 24 by the colloid 22.

Specifically, the concave part 24 is concaved from a surface of the substrate 21 facing the LED chip 23 to a surface of the substrate 21 opposite to the LED chip 23.

Wherein, the first end surface of the LED chip 23 is located above the top surface of the substrate 21, and the second end surface 232 of the LED chip 23 is located below the top surface of the substrate 21. The LED chip 23 is set inside the concave part 24, such that the overall height of the LED substrate 201 decreases, which protects the LED chip 23. Besides, the concave part 24 decreases the height of the gap between the LED substrate 201 and the thin film transistor substrate, which facilitates a thinner LED display panel.

Concerning the method for providing LED substrate in this second embodiment, please refer to the detail of the step of providing LED substrate of the method for manufacturing the display panel in this first embodiment, the same content will not be described herein.

Figure 3:
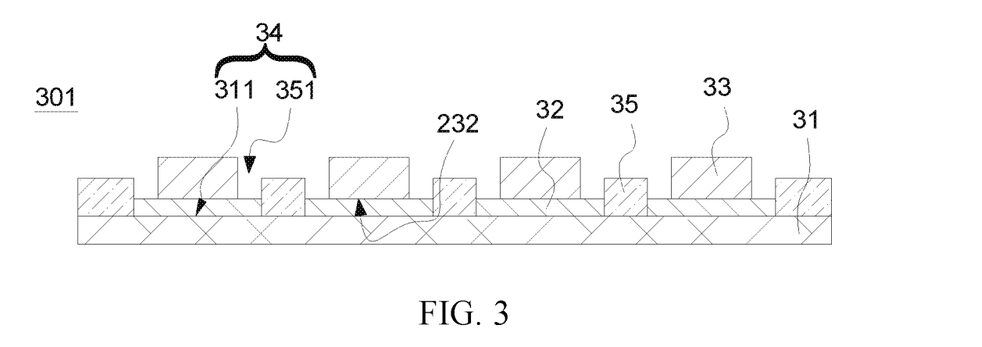
FIG. 3 is a structural schematic diagram of an LED substrate of a third embodiment of the present application.

Please refer to FIG. 3, FIG. 3 is a structural schematic diagram of an LED substrate of a third embodiment of this application. The LED substrate 301 of the third embodiment of this invention comprises a substrate 31, a colloid 32, and a plurality of LED chips 33. A plurality of concave parts 34 are set on the LED substrate 301. Each concave part 34 is fixedly set inside the concave part 34 by the colloid 32. The difference between the third embodiment and the second embodiment is:

The LED substrate 301 comprises an auxiliary layer 35. The auxiliary layer 35 is set on the substrate 31, and the auxiliary layer 35 comprises a plurality of through holes 351 that expose the substrate 31. The through holes and the exposed substrate 31 define the concave parts 34. Wherein, concerning the effect of setting the LED chip 33 inside the concave parts 34, please refer to the corresponding description in the second embodiment.

As a second end surface 332 of the LED chip 33 is a light outputting surface, the light outputting side of LED chip 33 is surrounded by the auxiliary layer 35. The auxiliary layer 35 improves interference between the lateral light of adjacent LED chips 33.

A material of the auxiliary layer 35 is a photoresist material, which can be one of polystyrene plastic, PFA (perfluoroalkoxy) plastic, or black resin material, but is not limited to that. In this third embodiment, the material of the auxiliary layer 35 is black resin photoresist, such that the auxiliary layer 35 can absorb the lateral light of the LED chips 33.

In some other embodiments, the material of the auxiliary layer 35 can be photoresist doped with light absorbing particles, such that the auxiliary layer 35 is capable of absorbing the lateral light of the LED chips 33. Furthermore, as the photoresist is doped with light absorbing particles, the wall of the through hole 351 is rough, which increases the stability of the colloid 12 and the auxiliary layer 35, thereby increasing the overall stability when the colloid 12 is in the final stage of curing.

Concerning the method for providing LED substrate in this third embodiment, please refer to the detail of the step of providing LED substrate of the method for manufacturing the display panel in this third embodiment, the same content will not be described herein.

Figure 4:
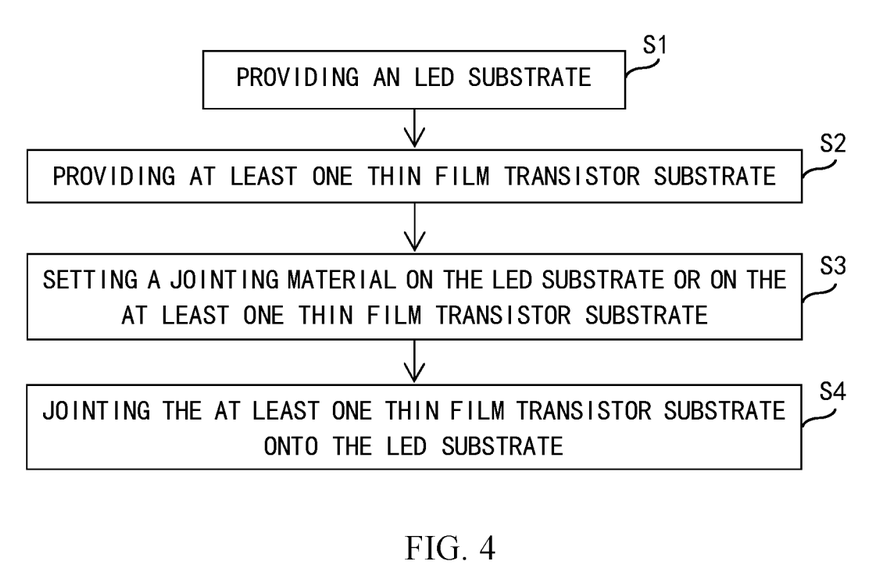
FIG. 4 is a flow chart of a method for manufacturing an LED display panel of the first embodiment of the present application.
Figure 5:
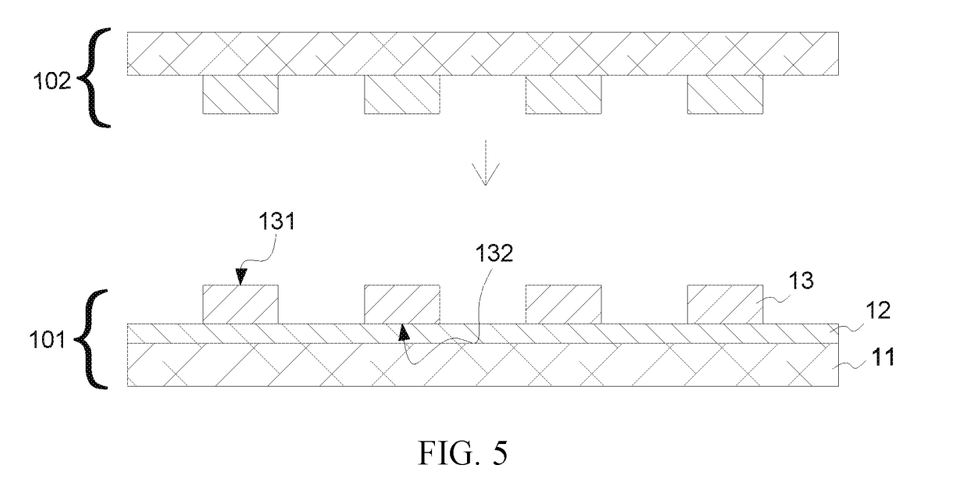
FIG. 5 is a jointing schematic diagram of step S4 of the method for manufacturing the LED display panel of the first embodiment of the present application.
Figure 6:
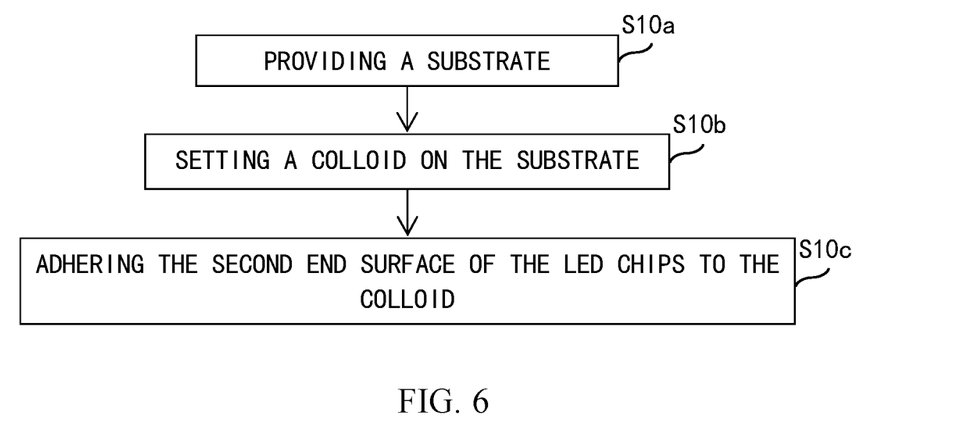
FIG. 6 is a flow chart of steps for providing the LED substrate of the method for manufacturing the LED display panel of the first embodiment of the present application.

Please refer to FIGS. 4-6, FIG. 4 is a flow chart of a method for manufacturing an LED display panel of the first embodiment of this application; FIG. 5 is the jointing schematic diagram of step S4 of the method for manufacturing the LED display panel of the first embodiment of this application; and FIG. 6 is a flow chart of the step of providing the LED substrate of the method for manufacturing LED display panel of the first embodiment of this application. The present invention also relates to the method for manufacturing the LED display panel, comprising:

Step S1: providing an LED substrate;

Step S2: providing at least one thin film transistor substrate;

Step S3: setting a jointing material on the LED substrate or on the at least one thin film transistor substrate;

Step S4: jointing the at least one thin film transistor substrate on the LED substrate.

In the method for manufacturing the LED display panel of this first embodiment, steps S1 and S2 are not sequenced, the detail step is as follows:

Step S1: providing an LED substrate 101;

wherein, the LED substrate comprises a plurality of LED chips 13, the LED chips 13 comprise a first end surface 131 and a second end surface 132, the first end surface 131 and the second end surface 132 are set opposite to each other, the first end surface 131 is for fixedly connecting with a thin film transistor substrate 102, and the second end surface 12 is a light outputting surface;

specifically, the step of providing the LED substrate 101, comprises:

Step S10a: providing a substrate 11;

Step S10b: setting a colloid 12 on the substrate 11;

Step S10c: adhering the second end surfaces 132 of a plurality of the LED chips 13 to the colloid 12.

In the step S10a, based on actual condition of demand, the substrate 11 can be a hard substrate, for example, a glass substrate, or can also be a flexible substrate, for example, a polyimide substrate. In this first embodiment, the substrate 11 is a hard substrate, but is not limited to that. Then, go to step S12.

In the step S10b, the colloid 12 can be one of hot degumming, hot melt adhesive, or ultraviolet (UV) curing adhesive, but is not limited to that. Then go to step S13.

In the step S10c, the LEDs chip 13 are micro-LED chips, but are not limited to that. The LED chips 13 are set on the colloid 12 by surface mounting technology (SMT) according to a predetermined LED chip pattern. As some of the LED chips 13 may experience position deviation during the SMT process, a timely adjustment is needed. To solve such technical problem, in this first embodiment, the colloid 12 can be hot degumming or hot melt adhesive, which facilitates adjustment of the LED chips 13.

Following is the description with an example of hot melt adhesive: the hot melt adhesive has the characteristics of three forms, namely an initial state, a hot melt state, and a curing state. The distribution of the adhesive natures of the three forms are 2%, 10%, and 100%, respectively. In the SMT process, the hot melt adhesive is in the initial state with the lowest adhesive nature, thereby facilitating the adjustment of the LED chips 13 having position deviation, and the hot melt adhesive in this state can also preliminarily fix the LED chips 13. Conducting hot melt after jointing and fixing to completely fix the LED chips 13 on the substrate 11.

In addition, UV curing adhesive also has two forms, namely an initial state with lower adhesive nature and a curing state with higher adhesive nature. UV irradiation is required for curing. And of course, the colloid 12 can be other glues.

Hence, alternatively, the colloid 12 is a colloid having at least two different kinds of adhesive nature.

Then, go to step S2.

Step S2: providing at least one thin film transistor substrate 102. The thin film transistor substrate 102 comprises a substrate and a plurality of thin film transistors. Then, go to step S3.

Step S3: setting a jointing material on the LED substrate 101 or on the thin film transistor substrate 102. Wherein, the jointing material is a heterogeneous conductive film or solder bump, and the jointing material is for electrically and fixedly connecting the first end surface 131 of the LED chip 13 and the thin film transistor substrate 102.

The jointing material can be set on the LED substrate 101, and can also be set on the thin film transistor substrate 102, in this embodiment, the jointing material is set on the LED substrate 101. Then, go to step S4.

Step S4: jointing a plurality of thin film transistor substrates 102 on the LED substrate 101. Please refer to FIG. 5. In this step, jointing the thin film transistors of a plurality of thin film transistor substrates through the jointing material with the first end surface 131 of corresponding LED chip 13 by a jointing equipment.

Wherein, it should be noted that if the colloid 12 is hot degumming, it is essential to strip the substrate 11 and the hot degumming after the jointing process, such that the LED display panel comprises only a thin film transistor substrate 102 and the LED chips 13.

Then, the method for manufacturing the LED display panel of the first embodiment of this application is completed.

Figure 7:
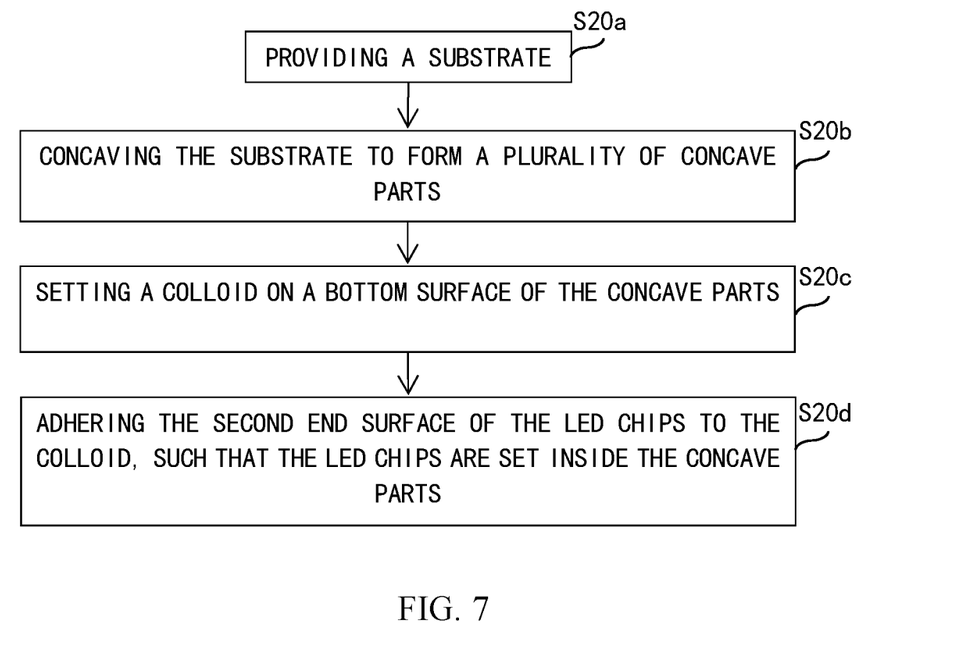
FIG. 7 is a flow chart of steps for providing the LED substrate of a method for manufacturing an LED display panel of the second embodiment of the present application.
Figure 8:
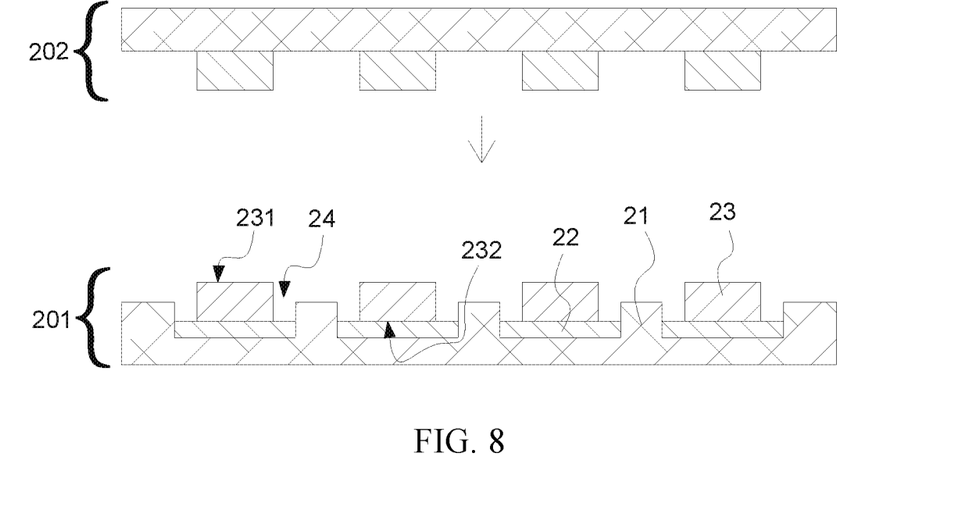
FIG. 8 is a jointing schematic diagram of step S4 of the method for manufacturing the LED display panel of the second embodiment of the present application.

Please refer to FIG. 7 and FIG. 8, FIG. 7 is a flow chart of a step of providing an LED substrate of a method for manufacturing an LED display panel of a second embodiment of this application; and FIG. 8 is a jointing schematic diagram of step S4 of the method for manufacturing the LED display panel of the second embodiment of this application. In the method for manufacturing the LED display panel of the second embodiment of this application, the difference between the manufacturing method of this second embodiment and the manufacture method of the first embodiment is step S1: providing the LED substrate 201.

In the method for providing the LED substrate of this second embodiment, the LED substrate comprises a plurality of LED chips 23. The LED chips 23 comprise a first end surface 231 and a second end surface 232, the first end surface 231 and the second end surface 232 are set opposite to each other, the first end surface 231 is for fixedly connecting with a thin film transistor substrate 202, and the second end surface 232 is a light outputting surface.

The step of providing the LED substrate 102, comprising:

S20a: providing a substrate 21;

S20b: concaving the substrate 21 to form a plurality of concave parts 24;

S20c: setting a colloid 22 on a bottom surface of the concave parts 24;

S20d: adhering the second end surfaces 232 of the plurality of LED chips 23 to the colloid 22, such that the LED chips 23 are set inside the concave parts 24.

In the step of S20b, concaving the substrate 21 by either dry etching or wet etching. Wherein, the first end surface of the LED chips 23 is located above the top surface of the substrate 21, and the second end surface 232 of the LED chips 23 is located below the top surface of the substrate 21. The LED chips 23 are set inside the concave parts 24, such that the overall height of the LED substrate 201 decreases, which protects the LED chips 23. Besides, the height of the gap between the LED substrate 201 and the thin film transistor substrate decreases after jointing the LED substrate 201 and the thin film transistor substrate (step S4), which facilitates a thinner LED display panel. Please refer to FIG. 8 to have a better idea of the effect of this structure.

In the step S20c, setting the colloid 22 inside the concave parts 24 either by coating or by ink jet printing. The colloid 22 is set only on the bottom surface of the concave parts 24, which saves the material of the colloid 22.

The other steps of the method for manufacturing the LED display panel of this second embodiment are similar or identical to the steps of the manufacturing method of the first embodiment. Please refer to the content of the manufacturing method of the first embodiment for details.

Figure 9:
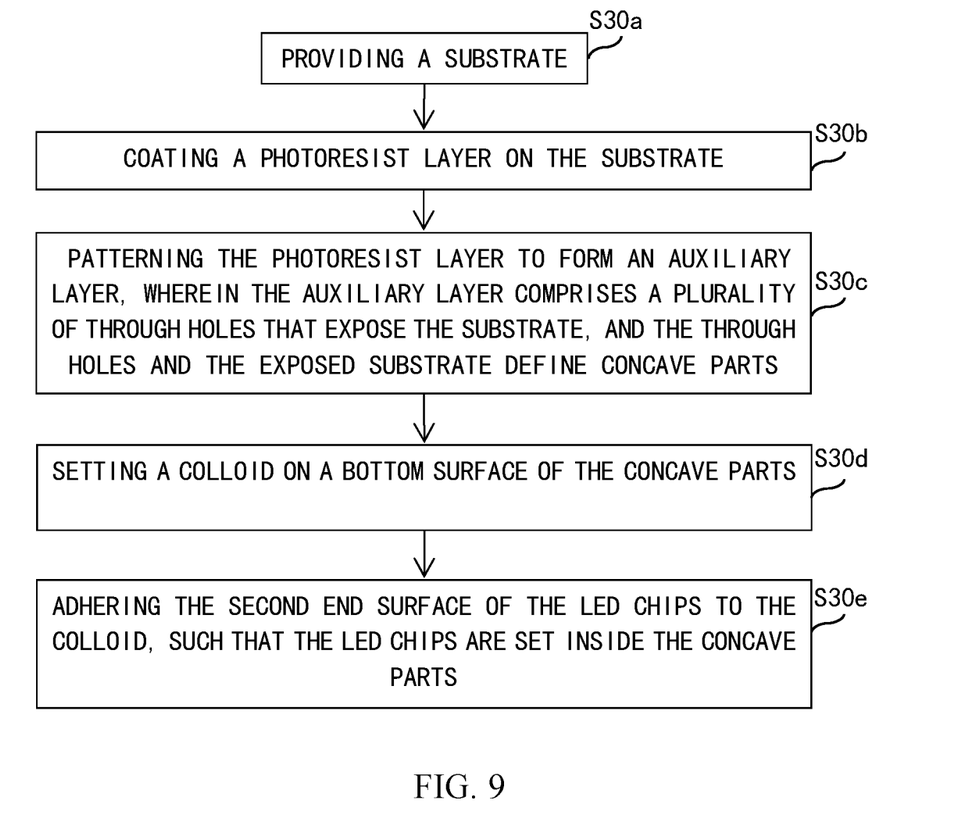
FIG. 9 is a flow chart of steps for providing the LED substrate of a method for manufacturing an LED display panel of the third embodiment of the present application.
Figure 10:
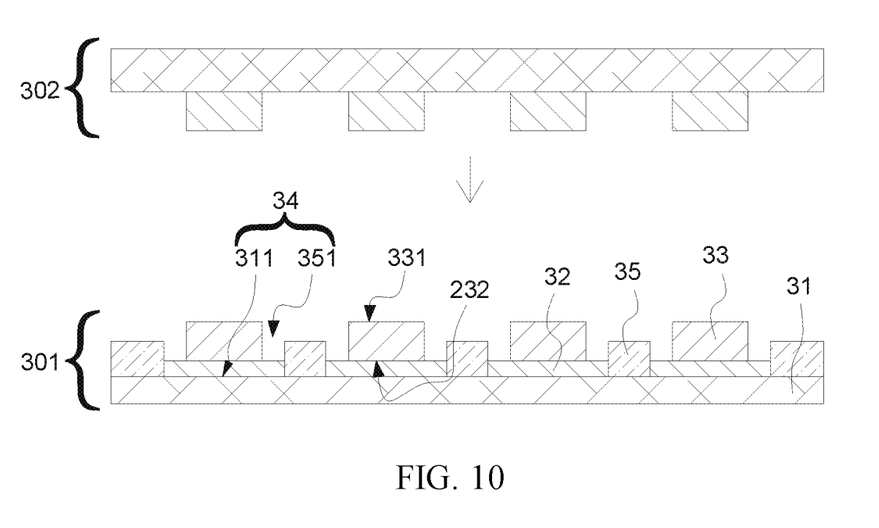
FIG. 10 is a jointing schematic diagram of step S4 of the method for manufacturing the LED display panel of the third embodiment of the present application.

Please refer to FIG. 9 and FIG. 10, FIG. 9 is a flow chart of a step of providing an LED substrate of a method for manufacturing an LED display panel of a third embodiment of this application; and FIG. 10 is a jointing schematic diagram of step S4 of the method for manufacturing the LED display panel of the third embodiment of this application. In the method for manufacturing the LED display panel of the third embodiment of this application, the difference between the manufacturing method of the third embodiment and the manufacturing method of the second embodiment is, step S1: providing the LED substrate 201.

In the method for providing the LED substrate of this third embodiment, the LED substrate comprises a plurality of LED chips 33. The LED chips 33 comprise a first end surface 331 and a second end surface 332, the first end surface 331 and the second end surface 332 are set opposite to each other, the first end surface 331 is for fixedly connecting with the thin film transistor substrate 302, and the second end surface 332 is a light outputting surface.

The step of providing the LED substrate 301, comprising:

S30*a*: providing a substrate 31;

S30*b*: coating a photoresist layer on the substrate 31;

S30*c*: patterning the photoresist layer to form an auxiliary layer 35, the auxiliary layer 35 comprises a plurality of through holes 351 that expose the substrate 31, and the through holes 351 and the exposed substrate 311 define a concave part 34;

S30*d*: setting a colloid 32 on a bottom surface of the concave part 34;

S30*e*: adhering the second end surfaces 332 of the plurality of LED chips 33 to the colloid 32, such that the LED chips 33 are set inside the concave parts 34.

Specifically, for one aspect, setting the LED chips 33 inside the concave part 34 can protect the LED chips 33 and thins the LED display panel, refer to FIG. 10 for details.

For another aspect, as the second end surface 332 of the LED chips is the light outputting surface, and the light outputting side of LED chips 33 is surrounded by the auxiliary layer 35. The auxiliary layer 35 improves the interference between the lateral light of adjacent LED chips 33.

A material of the auxiliary layer 35 is a photoresist, which can be one of polystyrene plastic, PFA (perfluoroalkoxy) plastic, or black resin material, but is not limited to that. In this third embodiment, the material of the auxiliary layer 35 is black resin photoresist, such that the auxiliary layer 35 can absorb the lateral light of the LED chips 33.

In some other embodiments, the material of the auxiliary layer 35 can be photo resist doped with light absorbing particles, such that the auxiliary layer 35 is capable of absorbing the lateral light of the LED chips 33. Furthermore, as the photo resist is doped with light absorbing particles, the wall of the through hole 351 is rough, which increases the stability of the colloid 12 and the auxiliary layer 35, thereby increasing the overall stability when the colloid 12 is in the final stage of curing.

The other steps of the method for manufacturing the LED display panel of this third embodiment are similar or identical to the steps of the manufacturing method of the first embodiment. Please refer to the content of the manufacturing method of the first embodiment for details.

Compared with the method for manufacturing micro-LED display panel of prior art, the method for manufacturing LED display panel of the present application forms a large-sized LED display panel directly, by first fixing the LED chips on the substrate to form an LED substrate, and then jointing a plurality of thin film transistor substrates with the LED chips of the LED substrate correspondingly, which solves the technical problem of low production yield when manufacturing large-sized micro-LED display panel by the present method for manufacturing micro-LED display panel.

As described above, those skilled in the art may make various other corresponding changes and deformation according to the technical scheme and technical concept of this application, and all such changes and deformation shall fall within the protection scope of the claims attached to this application.

What is claimed is:

1. An light-emitting diode (LED) substrate for manufacturing an LED display panel, wherein the LED substrate comprises:
   a substrate, wherein the substrate is a hard substrate;
   a colloid set on the substrate; and
   a plurality of LED chips, wherein each of the LED chips comprises a first end surface and a second end surface, the first end surface and the second end surface are set opposite to each other, the first end surface is fixedly connected to a corresponding one of a plurality of thin film transistor substrates, and the second end surface is a light outputting surface;
   wherein the second end surface of the LED chips is fixedly set on the substrate by the colloid,
   wherein the LED substrate is jointed to the plurality of thin film transistor substrates,
   wherein the LED substrate comprises a first flat surface, the first flat surface faces the second end surfaces of the plurality of LED chips, and a level of the second end surface of the LED chip is higher than a level of the first flat surface of the LED substrate.

2. An LED substrate for manufacturing an LED display panel, wherein the LED substrate comprises:
   a substrate;
   a colloid set on the substrate; and
   a plurality of LED chips, wherein each of the LED chips comprises a first end surface and a second end surface, the first end surface and the second end surface are set opposite to each other, the first end surface is fixedly connected to a corresponding one of a plurality of thin film transistor substrates, and the second end surface is a light outputting surface;
   wherein the second end surface of the LED chips is fixedly set on the substrate by the colloid,
   wherein the LED substrate is jointed to the plurality of thin film transistor substrates,
   wherein the LED substrate comprises a first flat surface, the first flat surface faces the second end surfaces of the plurality of LED chips, and a level of the second end surface of the LED chip is higher than a level of the first flat surface of the LED substrate.

3. A method for manufacturing an LED display panel, comprising:
   providing an LED substrate;
   providing a plurality of thin film transistor substrates;
   setting a jointing material on the LED substrate or on the plurality of thin film transistor substrates; and
   jointing the plurality of thin film transistor substrates onto the LED substrate,
   wherein the LED substrate comprises a plurality of LED chips, each of the LED chips comprises a first end surface and a second end surface, the first end surface and the second end surface are set opposite to each other, the first end surface is fixedly connected to a corresponding one of the plurality of thin film transistor substrates, and the second end surface is a light outputting surface; and
   the step of providing the LED substrate, further comprising:
   providing a substrate;
   setting a colloid on the substrate; and
   adhering the second end surface of the LED chips to the colloid, wherein the one LED substrate comprises a first flat surface, the first flat surface faces the second end surfaces of the plurality of LED chips, and a level of the second end surface of the LED chip is higher than a level of the first flat surface of the one LED substrate.

4. The method for manufacturing the LED display panel as claimed in claim 3, wherein the jointing material is a heterogeneous conductive film or solder; and the step of jointing the plurality of thin film transistor substrates on the LED substrate, further comprising:

jointing thin film transistors of the plurality of thin film transistor substrates with the first end surface of a corresponding LED chip by the jointing material, respectively.

* * * * *